(12) United States Patent
Choi et al.

(10) Patent No.: US 7,378,328 B2
(45) Date of Patent: May 27, 2008

(54) METHOD OF FABRICATING MEMORY DEVICE UTILIZING CARBON NANOTUBES

(75) Inventors: Won-bong Choi, Yongin (KR); In-kyeong Yoo, Suwon (KR); Jae-uk Chu, Gwangmyeong (KR)

(73) Assignee: Samsung Electronics Co., Ltd., Suwon, Kyungki-do (KR)

( * ) Notice: Subject to any disclaimer, the term of this patent is extended or adjusted under 35 U.S.C. 154(b) by 144 days.

(21) Appl. No.: 11/352,310

(22) Filed: Feb. 13, 2006

(65) Prior Publication Data

US 2006/0252276 A1 Nov. 9, 2006

Related U.S. Application Data

(62) Division of application No. 10/361,024, filed on Feb. 10, 2003, now Pat. No. 7,015,500.

(30) Foreign Application Priority Data

Feb. 9, 2002 (KR) .................. 2002-7709
Nov. 16, 2002 (KR) ................. 2002-71398

(51) Int. Cl.
*H01L 21/20* (2006.01)

(52) U.S. Cl. .............. 438/381; 438/238; 438/513; 438/680; 257/E21; 257/17; 257/41; 257/277; 257/645; 257/E51; 257/4; 257/38; 257/E23; 257/74; 257/165

(58) Field of Classification Search .......... 438/381, 438/197, 238, 513, 680, 954, 776, 788, 795
See application file for complete search history.

(56) References Cited

U.S. PATENT DOCUMENTS 6,423,583 B1 * 7/2002 Avouris et al. ............. 438/132
6,515,339 B2 * 2/2003 Shin et al. .................. 257/368
7,015,500 B2 * 3/2006 Choi et al. .................... 257/40
2001/0001681 A1 * 5/2001 Zhang et al. ............... 427/508
2001/0023986 A1 * 9/2001 Mancevski .................. 257/741
2002/0004136 A1 * 1/2002 Gao et al. ................... 428/367
2002/0153160 A1 * 10/2002 Hofmann et al. ........... 174/117

FOREIGN PATENT DOCUMENTS

EP 1 091 418 4/2001

OTHER PUBLICATIONS

Tans, S.J. "Room-temperature transistor based on a single carbon nanotube", NATURE, 393:49-52 (May 7, 1998).
Tans, S.J., "Potential modulations along carbon nanotubes", NATURE, 404:834-835, (Apr. 20, 2000).
Choi, W.B., et al., "Carbon-nanotube-based nonvolatile memory with oxide-nitride-oxide film and nanoscale channel", Applied Physics Letters, 82(2):275-277, (Jan. 13, 2003).

* cited by examiner

*Primary Examiner*—David Nhu
(74) *Attorney, Agent, or Firm*—Lee & Morse, P.C.

(57) ABSTRACT

A fast, reliable, highly integrated memory device formed of a carbon nanotube memory device and a method for forming the same, in which the carbon nanotube memory device includes a substrate, a source electrode, a drain electrode, a carbon nanotube having high electrical and thermal conductivity, a memory cell having excellent charge storage capability, and a gate electrode. The source electrode and drain electrode are arranged with a predetermined interval between them on the substrate and are subjected to a voltage. The carbon nanotube connects the source electrode to the drain electrode and serves as a channel for charge movement. The memory cell is located over the carbon nanotube and stores charges from the carbon nanotube. The gate electrode is formed in contact with the upper surface of the memory cell and controls the amount of charge flowing from the carbon nanotube into the memory cell.

20 Claims, 17 Drawing Sheets

METHOD OF FABRICATING MEMORY DEVICE UTILIZING CARBON NANOTUBES

CROSS REFERENCE TO RELATED APPLICATION(S)

This is a divisional application based on application Ser. No. 10/361,024, filed Feb. 10, 2003, now U.S. Pat. No. 7,015,500 the entire contents of which is hereby incorporated by reference.

BACKGROUND OF THE INVENTION

1. Field of the Invention

The present invention relates to a memory device and a method of fabricating the same. More particularly, the present invention relates to a memory device including a carbon nanotube that serves as a charge moving channel and a method of fabricating the memory device.

2. Description of the Related Art

Semiconductor memory devices fundamentally include a capacitor that preserves stored charges and a transistor that serves as a switch for securing a path of current necessary to write data to or read data from the capacitor.

To allow a high current to flow in a transistor, the transistor must have a high transconductance (gm). Hence, metal oxide field effect transistors (MOSFETs) having a high transconductance have been commonly used as switching devices of semiconductor memory devices.

MOSFETs basically include gate electrodes made of doped polycrystalline silicon and source and drain electrodes made of doped crystalline silicon.

The transconductance of MOSFETs is inversely proportional to the length (L) of a channel and the thickness of a gate oxide film, and is directly proportional to surface mobility, permittivity of the gate oxide film, and the width (W) of the channel. Since the surface mobility and the permittivity of the gate oxide film are respectively predetermined by a directional silicon wafer and a silicon oxide film, a high transconductance may be obtained by increasing a W/L ratio of the channel or by thinning the gate oxide film.

However, manufacturing highly integrated memory devices requires reducing the physical size of MOSFETs, which in turn requires reducing the physical sizes of gate, source, and drain electrodes, which leads to a variety of problems. When the size of a gate electrode in a transistor is reduced, the cross sectional area of the gate electrode is proportionately reduced. Such a reduction in the cross sectional area of a gate electrode leads to the formation of a high electrical resistance in the transistor. Similarly, the size of source and drain electrodes are reduced by reducing the thicknesses, or junction depths, thereof, also leading to the creation of a larger electrical resistance.

When reducing the size of a MOSFET, a distance between a source and a drain may be decreased, generating a phenomenon known as "punch through," in which the source and a depletion layer of the drain come into contact, making it impossible to adjust the current flow. In addition, such a reduction in the size of a memory device causes the width of a channel serving as a current path to be reduced to 70 nm or less, preventing a smooth flow of current. Increased electrical resistance, punch through, and decreased channel width in MOSFETs result in heat loss, increased power consumption, electrical characteristic variations, charge leakage, etc., ultimately causing unacceptable memory device function.

Therefore, reducing the size of MOSFETs to create highly integrated semiconductor memory devices is limited by the inherent physical characteristics of MOSFETs. As a result, general memory devices based on MOSFETs are not suitable for use as future high-density memory devices, and an alternative is needed.

SUMMARY OF THE INVENTION

The present invention provides a fast, highly-integrated memory device capable of preventing an increase in resistance caused by miniaturization of the memory device, and capable of providing low thermal loss, low power consumption, stable electrical characteristics, and a low charge leakage.

According to a feature of an embodiment of the present invention, there is provided a carbon nanotube memory device including a substrate, a source electrode and a drain electrode arranged with a predetermined interval between them on the substrate and subjected to a voltage, a carbon nanotube connecting the source electrode to the drain electrode and serving as a channel for charges, a memory cell, located over the carbon nanotube, that stores charges from the carbon nanotube, and a gate electrode, formed in contact with the upper surface of the memory cell, for controlling the amount of charge flowing from the carbon nanotube into the memory cell.

The substrate is preferably formed of silicon, and a silicon oxide film may be deposited on the substrate.

The memory cell preferably includes a first insulating film formed in contact with the upper surface of the carbon nanotube; a charge storage film, deposited on the first insulating film, that stores charges; and a second insulating film formed on the charge storage film and contacting the gate electrode.

In the memory cell, the thickness of the first insulating film is preferably similar to the thickness of the charge storage film. Also in the memory cell, the thickness of the second insulating film may be approximately double the thickness of the charge storage film. The first and second insulating films may be formed of silicon oxide, and the charge storage film may be formed of one of silicon and silicon nitride. Preferably, the charge storage film has a thickness of 15 nm or less. The charge storage film may be a porous film having a plurality of nanodots filled with a charge storage material.

In an alternative embodiment of the carbon nanotube memory device of the present invention, the memory cell includes a third insulating film formed in contact with the lower surface of the gate electrode, and a porous film positioned below the third insulating film and formed in contact with the carbon nanotube, the porous film having a plurality of nanodots filled with a charge storage material.

The thickness of the third insulating film may be approximately double the thickness of the porous film or may be similar to the thickness of the porous film.

The third insulating film may be formed of silicon oxide, and the charge storage material may be one of silicon and silicon nitride.

The porous film may be formed of aluminum oxide.

Preferably, a nanodot has a diameter of 15 nm or less.

According to another feature of an embodiment of the present invention, there is provided a method of fabricating a carbon nanotube memory device including: (a) growing a carbon nanotube on a substrate and forming a source electrode and a drain electrode in contact with the carbon nanotube such that the carbon nanotube between the source electrode and the drain electrode serves as a charge moving channel; (b) forming a memory cell in contact with the carbon nanotube by sequentially depositing a first insulating film, a charge storage film, and a second insulating film on the carbon nanotube, the source electrode, and the drain electrode, and patterning the resultant structure using a photolithographic method; and (c) forming a gate electrode which controls the amount of charge flowing from the carbon nanotube into the charge storage film by depositing a metal layer on the second insulating film and patterning the resultant structure using a photolithographic method.

In (a), an insulating layer is formed on the upper surface of the substrate, and the carbon nanotube is grown on the upper surface of the insulating layer. Preferably, the substrate is formed of silicon, and the insulating layer is formed of silicon oxide. Also in (a), the source and drain electrodes may be formed by e-beam lithography.

Preferably, in (b), the first insulating film is deposited to a thickness similar to the thickness of the charge storage film. In (b), the second insulating film may be deposited to a thickness approximately double the thickness of the charge storage film.

The first and second insulating films are preferably formed of silicon oxide. Preferably, the charge storage film is formed of one of silicon and silicon nitride.

Preferably, the charge storage film has a thickness of 15 nm or less.

According to another feature of an embodiment of the present invention, there is provided a method of fabricating a carbon nanotube memory device including: growing a carbon nanotube on a substrate and forming a source electrode and a drain electrode in contact with the carbon nanotube such that the carbon nanotube between the source electrode and the drain electrode serves as a charge moving channel; (b) forming a porous film having a plurality of nanodots by depositing a first insulating film on the upper surfaces of the carbon nanotube and the source and drain electrodes, and anodizing and etching the first insulating film; (c) filling the nanodots with a charge storage material by depositing the charge storage material on the upper surface of the porous film and then etching the charge storage material; (d) forming a memory cell by depositing a second insulating film on the upper surface of the porous film and patterning the first insulating film, the porous film, and the second insulating film using a photolithographic method; and (e) forming a gate electrode which controls the amount of charge flowing from the carbon nanotube into the charge storage film by depositing a metal layer on the second insulating film and patterning the resultant structure using a photolithographic method.

In the method of fabricating a carbon nanotube memory device, in (a), an insulating layer is preferably formed on the upper surface of the substrate, and the carbon nanotube is preferably grown on the upper surface of the insulating layer. Here, the substrate is preferably formed of silicon, and the insulating layer is preferably formed of silicon oxide.

In (a), the source and drain electrodes are preferably formed by e-beam lithography.

In (b), the first insulating film may be deposited to a thickness similar to the thickness of the porous film, and the second insulating film may be deposited to a thickness approximately double the thickness of the porous film.

The first and second insulating films are preferably formed of silicon oxide. The charge storage film is preferably formed of one of silicon and silicon nitride.

Preferably, the porous film is formed to a thickness of 15 nm or less.

In the method of fabricating a carbon nanotube memory device, also in (a), the entire first insulating film may be oxidized to form the porous film having the plurality of nanodots.

In the present invention, because a carbon nanotube is used as a charge moving channel, a doping process for a semiconductor memory device is not required. Furthermore, because a carbon nanotube having a high electrical conductivity and a high thermal conductivity is used, an increase in resistance and malfunction due to the high-integration of a memory device are prevented. Also, because the memory device according to the present invention includes the charge storage film to store charge, or a porous film having nanodots, the memory device functions as a highly efficient, highly-integrated memory device.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

This application relies for priority upon Korean Patent Application No. 2002-7709, filed Feb. 9, 2002, and Korean Patent Application No. 2002-71398, filed Nov. 16, 2002, the contents of which are incorporated herein by reference in their entirety.

Figure 1:
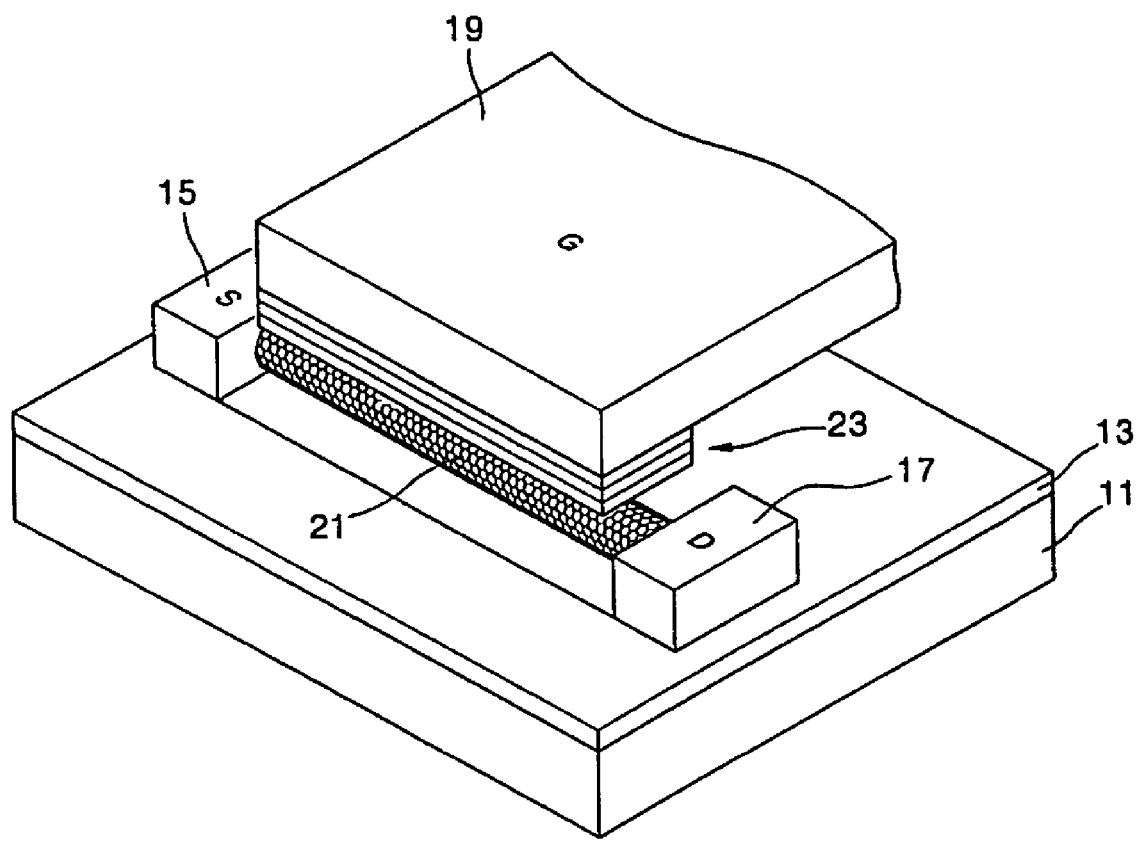
FIG. 1 illustrates a perspective view of a memory device according to an embodiment of the present invention.

Referring to FIG. 1, a memory device according to an embodiment of the present invention includes a substrate 11, an insulating layer 13 deposited on the substrate 11, a source electrode 15 and a drain electrode 17 which are made of metal and separated by a predetermined distance from each other on the insulating layer 13, a carbon nanotube 21 which connects the source electrode 15 to the drain electrode 17 and serves as an electron moving channel, a memory cell 23 which contacts the carbon nanotube 21 and stores charges of electrons (or holes), and a gate electrode 19 which contacts the memory cell 23 and controls the movement of the electrons.

In FIG. 1, the source and drain electrodes 15 and 17 are installed on the substrate 11. However, the source and drain electrodes 15 and 17 may be installed within the substrate 11. In this case, the carbon nanotube 21 is also located within the substrate 11, or installed in contact with the inner surface of the substrate 11.

The substrate 11 is generally made of silicon, and the insulating layer 13 formed on the substrate 11 is made of silicon oxide.

The source and drain electrodes 15 and 17 may be formed of a metal such as titanium (Ti) or gold (Au). The gate electrode 19 may be formed of a metal such as polysilicon. The transistor structure is formed by well-known semiconductor processes, such as, photolithography, e-beam lithography, etching, oxidation, and thin film deposition.

The carbon nanotube 21 is a carbon allotrope having a honeycomb shape formed by combining carbon atoms with one another. In other words, the carbon nanotube 21 has a shape in which a graphite sheet formed by a combination of a plurality of carbon atoms is rolled in a circle with a nano-sized diameter. The carbon nanotube 21 has either metal properties or semiconductor properties depending on the rolling angle and structure of the graphite sheet. These characteristics of carbon nanotubes (CNTs) are being actively studied in up-to-date industrial fields, particularly, in the field of nano-technology.

CNTs are classified into two different types according to their electrical properties. One type of CNT is a metallic CNT, which exhibits ohmic electronic behavior and is unaffected by a gate voltage. The other type of CNT is a semiconductor CNT, which exhibits non-ohmic electronic behavior and is affected by a gate voltage.

The carbon nanotube 21 used in the memory device according to an embodiment of the present invention is a semiconductor CNT. A flow of electrons moving through the carbon nanotube 21, that is, current, is controlled by varying a voltage applied to the gate electrode 19.

The carbon nanotube 21 may be manufactured by arc discharge, laser vaporization, plasma enhanced chemical vapor deposition (PECVD), thermal chemical vapor deposition, vapor phase growth, or another similar process.

Figure 2:
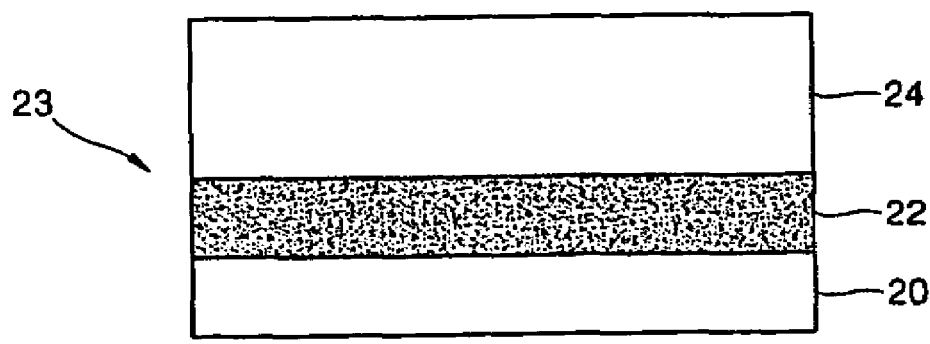
FIG. 2 illustrates a cross section of a first memory cell adopted in a memory device according to an embodiment of the present invention.
Figure 3A:
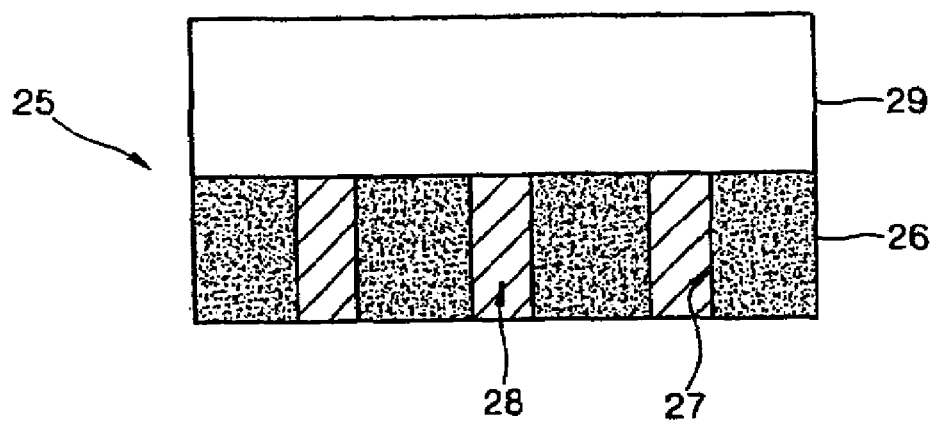
FIG. 3A illustrates a cross section of a second memory cell adopted in a memory device according to an embodiment of the present invention.
Figure 3B:
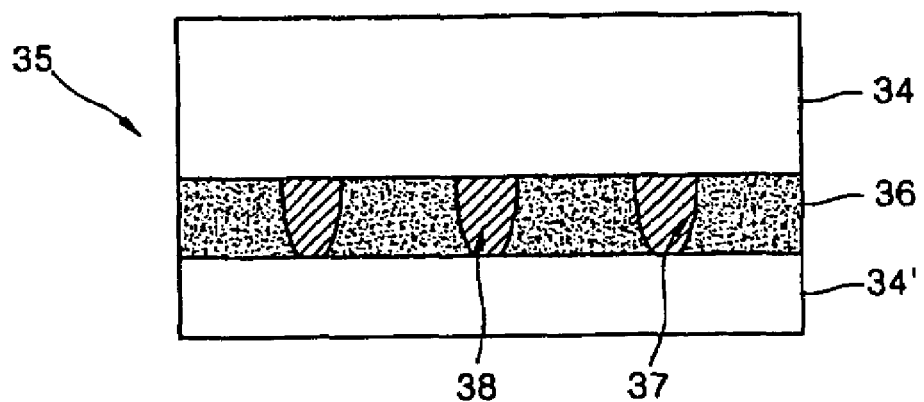
FIG. 3B illustrates a cross section of a third memory cell adopted in a memory device according to an embodiment of the present invention.

First, second, and third memory cells 23, 25, and 35 used in a memory device according to an embodiment of the present invention are shown in FIGS. 2, 3A, and 3B, respectively.

Referring to FIG. 2, the first memory cell 23 used in the memory device according to an embodiment of the present invention includes first and second insulating films 20 and 24 and a charge storage film 22. The charge storage film 22 stores charges in the form of electrons or holes, and is interposed between the first and second insulating films 20 and 24. In this embodiment, the first and second insulating films 20 and 24 are formed of silicon oxide $SiO_2$, and the charge storage film 22 is formed of silicon (Si) or silicon nitride ($Si_3N_4$).

In particular, a $Si_3N_4$ thin film is provided as a low-potential trap site that can store a plurality of charges.

Preferably, the thickness of the entire first memory cell 23 is about 60 nm, and the thickness of the charge storage film 22 is about 15 nm or less. It was confirmed that a silicon film or a silicon nitride film used as the charge storage film 22 was able to store electrons when it had a thickness of 100 nm or less. Preferably, the first insulating film 20 is thin enough to facilitate tunnelling of the electrons or holes from the carbon nanotube 21 of FIG. 1 through the first insulating film 20 and the second insulating film 24 is thick enough to prevent the introduction of charges from the gate electrode 19 of FIG. 1 into the second insulating film 24, and to preserve charges stored in the charge storage film 22 for a long period of time. For example, the first insulating film 20 may be a 7 nm oxide thin film, the charge storage film 22 may be a 7 nm $Si_3N_4$ thin film, and the second insulating film 24 may be a 14 nm oxide thin film. Here, the first insulating film 20, the charge storage film 22, and the second insulating film 24 are formed to have a thickness ratio of 1:1:2 so that charges from the carbon nanotube 21 may be stably stored in the charge storage film 22 for a long period of time.

FIG. 3A illustrates a cross section of the second memory cell 25 adopted in a memory device according to an embodiment of the present invention. As shown in FIG. 3A, the second memory cell 25 includes a third insulating film 29 formed in contact with the gate electrode 19, and a porous film 26 which is formed below the third insulating film 29 and has a plurality of nanodots 27 filled with a charge storage material 28.

The third insulating film 29 may be formed of silicon oxide, and the charge storage material 28 may be silicon or silicon nitride. Preferably, the third insulating film 29 is thicker than the porous film 26 so that the charge storage material 28 may be stably stored in the nanodots 27.

FIG. 3B illustrates a cross section of the third memory cell 35 adopted in a memory device according to an embodiment of the present invention. The third memory cell 35 has a structure in which an insulating film is further formed below the porous film 26 of the second memory cell 25 of FIG. 3A. Accordingly, the third memory cell 35 includes a fourth insulating film 34, a porous film 36 having a plurality of nanodots 37 filled with a charge storage material 38, and a fifth insulating film 34'. Preferably, the fourth insulating film 34 is thick enough to prevent the introduction of charges from the gate electrode 19 of FIG. 1 into the fourth insulating film 34, and to preserve charges stored in the charge storage film 38 for a long period of time. It is also preferable that the fifth insulating film 34' is thin enough to facilitate tunnelling of the electrons or holes from the carbon nanotube 21 through the fifth insulating film 34' so they may move into the porous film 36.

Figure 4:
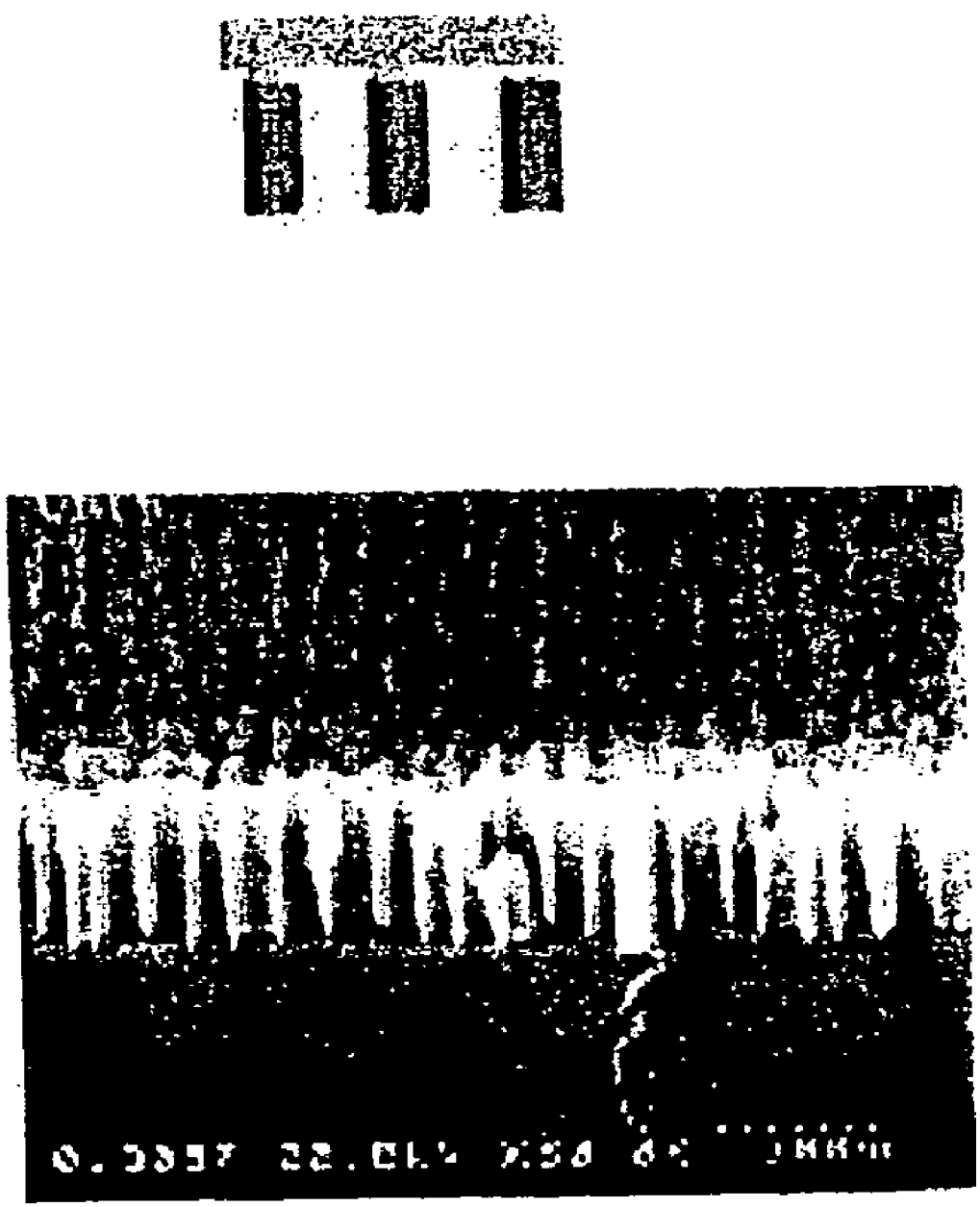
FIG. 4 illustrates a scanning electron microscopy (SEM) picture of the third memory cell adopted in a memory device according to an embodiment of the present invention.

FIG. 4 illustrates a scanning electron microscopy (SEM) picture of the third memory cell 35 adopted in a memory device according to an embodiment of the present invention. In the SEM picture, the fourth insulating film 34 is formed of $SiO_2$, the porous film 36 and the fifth insulating film 34' are formed of $Al_2O_3$, and the charge storage material 38 is formed of Si (or $Si_3N_4$).

Figure 5A:
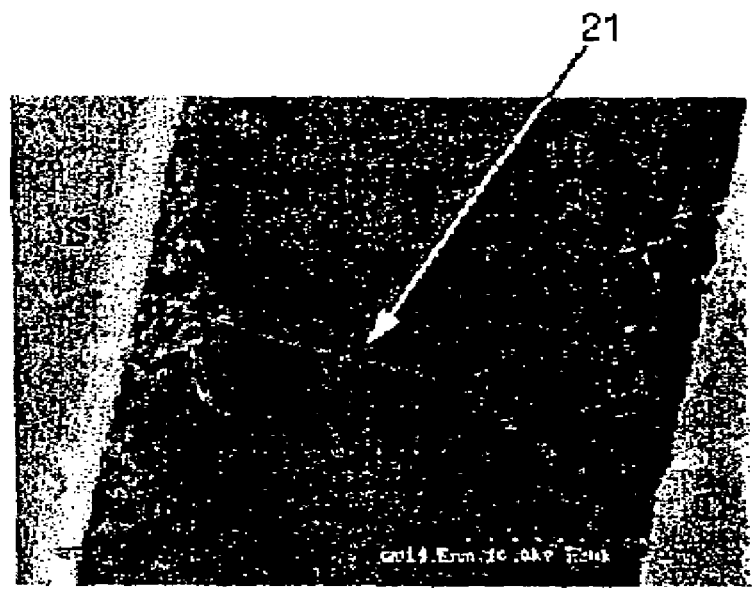
FIGS. 5A and 5B illustrate SEM pictures of a memory device according to an embodiment of the present invention.
Figure 5B:
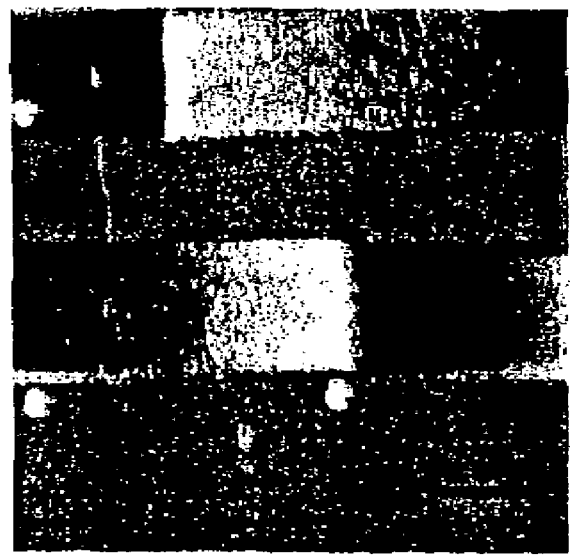

FIGS. 5A and 5B illustrate SEM pictures showing the carbon nanotube 21 that connects the source electrode 15 to the drain electrode 17 in a memory device according to an embodiment of the present invention. Using an atomic energy microscopy, the carbon nanotube 21 was measured to have a diameter of about 3nm.

Figure 6A:
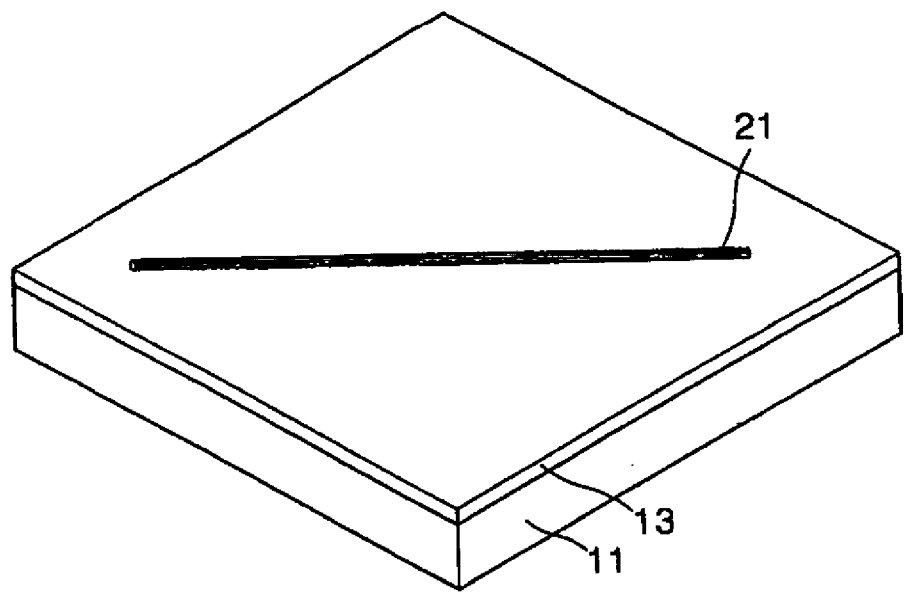
FIGS. 6A through 6I represent perspective views for illustrating a method of manufacturing a memory device according to an embodiment of the present invention employing the first memory cell.

FIGS. 6A through 6I depict perspective views for illustrating a method of manufacturing a memory device according to an embodiment of the present invention employing the first memory cell 23. First, referring to FIG. 6A, insulating layer 13 is deposited on the upper surface of a substrate 11, and a carbon nanotube 21 then grows on the insulating layer 13. CNT powder created by CVD is scattered into a chloroform solution and then coated and dried at several places over the insulating layer 13. FIG. 6A shows a single carbon nanotube 21 formed at one place on the substrate 11.

Figure 6B:
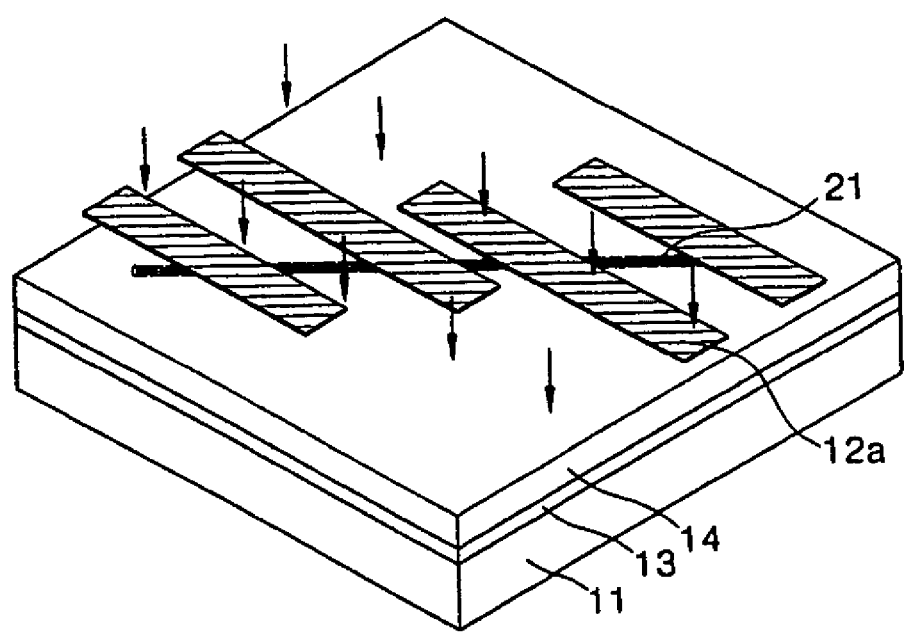
Figure 6C:
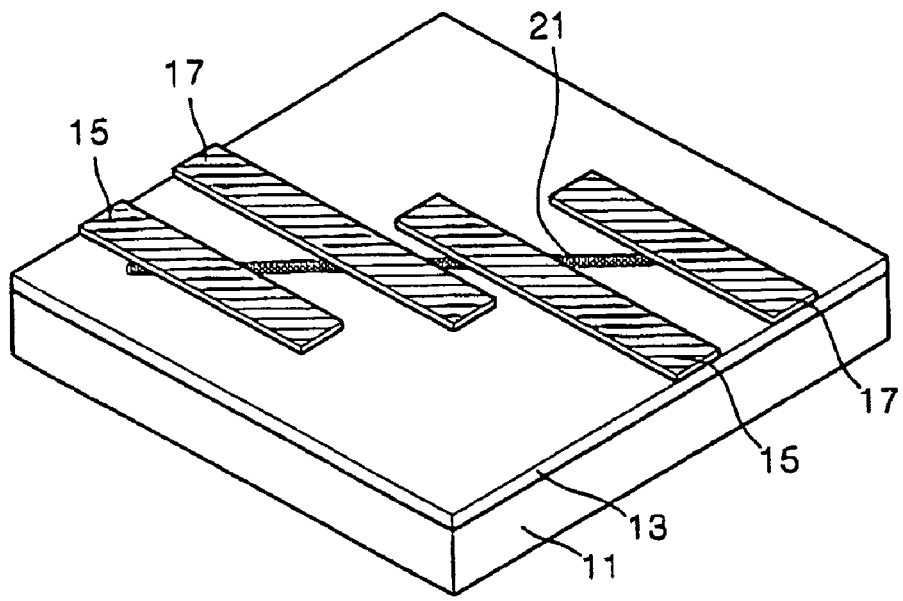

Next, as shown in FIG. 6B, a conductive material layer 14 for forming the source and drain electrodes 15 and 17 of FIG. 1 is deposited on the insulating layer 13, and a mask 12a is then used to pattern the conductive material layer 14 by e-beam lithography. For example, the conductive material layer 14 may be formed of a metal, such as Au or Ti. Preferably, the source and drain electrodes 15 and 17 of FIG. 1 formed after the mask patterning are thermally annealed to reduce contact resistance thereof. For example, the source and drain electrodes 15 and 17 of FIG. 1 may be quickly annealed at 600° C. for about 30 seconds. The source and drain electrodes 15 and 17 formed in this way are shown in FIG. 6C.

Figure 6D:
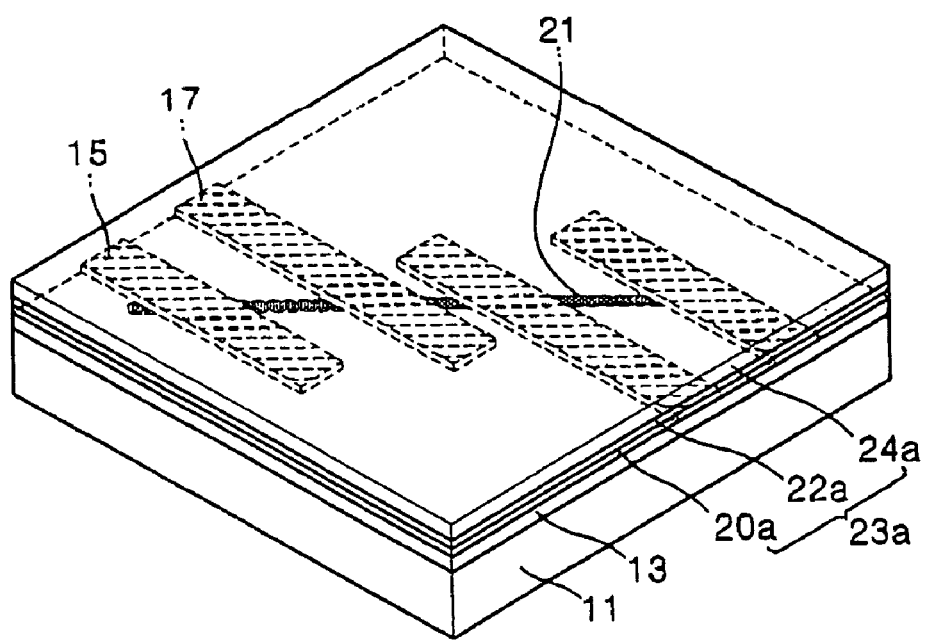
Figure 6E:
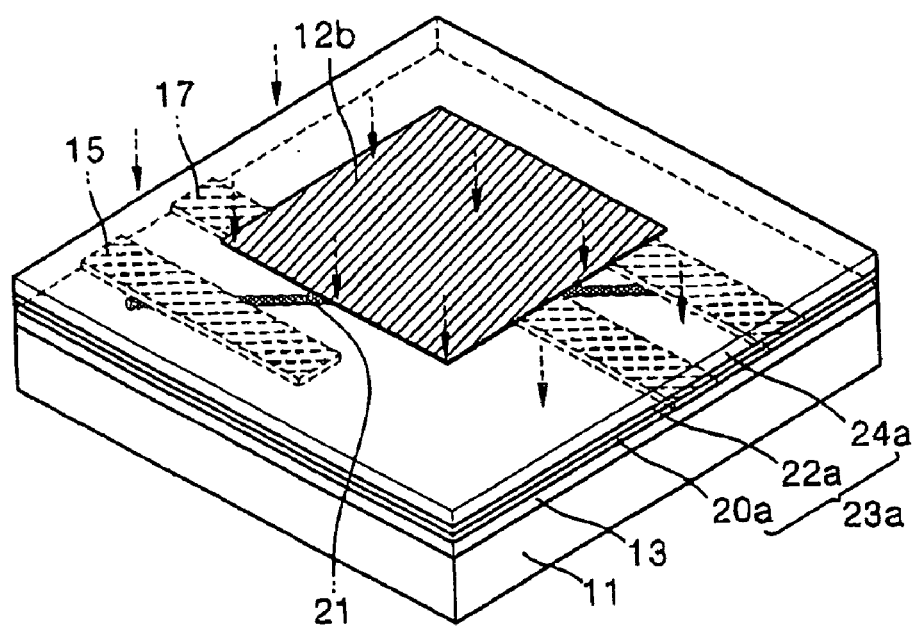
Figure 6F:
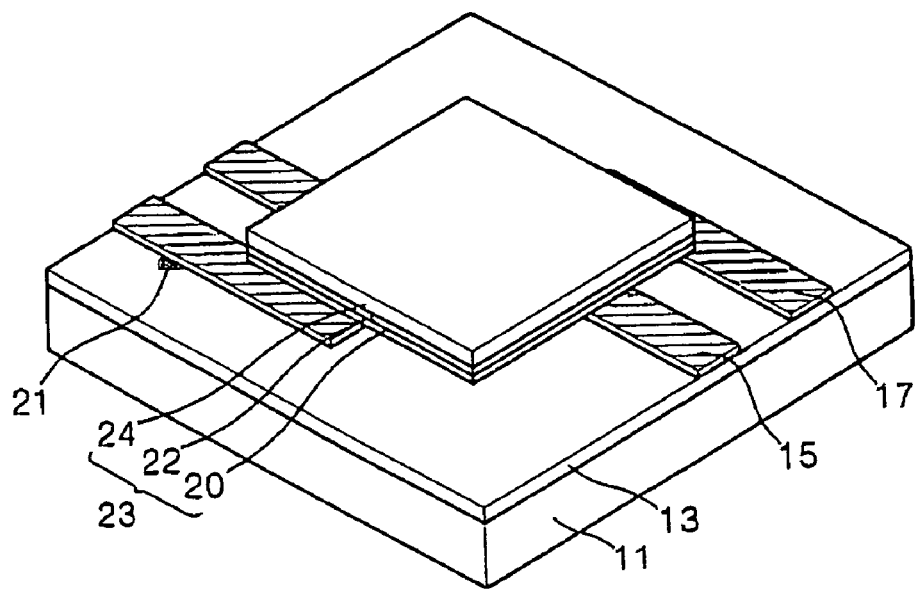

FIGS. 6D through 6F illustrate a process of depositing the first memory cell 23. Referring to FIG. 6D, a first insulating film 20a, a charge storage film 22a, and a second insulating film 24a are sequentially deposited on the source and drain electrodes 15 and 17, on the carbon nanotube 21 connecting the source electrode 15 to the drain electrode 17, and on the insulating layer 13, thereby forming a memory cell 23a. As shown in FIG. 6E, a mask 12b is positioned over the resultant structure of FIG. 6D and exposed to light, and then the resulting structure is developed. As shown in FIG. 6F, the first memory cell 23 is formed in contact with the upper surface of the source and drain electrodes 15 and 17 and the upper surface of the carbon nanotube 21. The first memory cell 23 includes a first insulating film 20 made of oxide, a charge storage film 22 made of Si or $Si_3N_4$, and a second insulating film 24 made of oxide. An oxide film is formed by CVD using a mixture of $SiH_4$ gas and $O_2$ gas, and a $Si_3N_4$ film is formed by CVD using $SiH_2Cl_2$ gas and $NH_3$ gas.

Figure 6G:
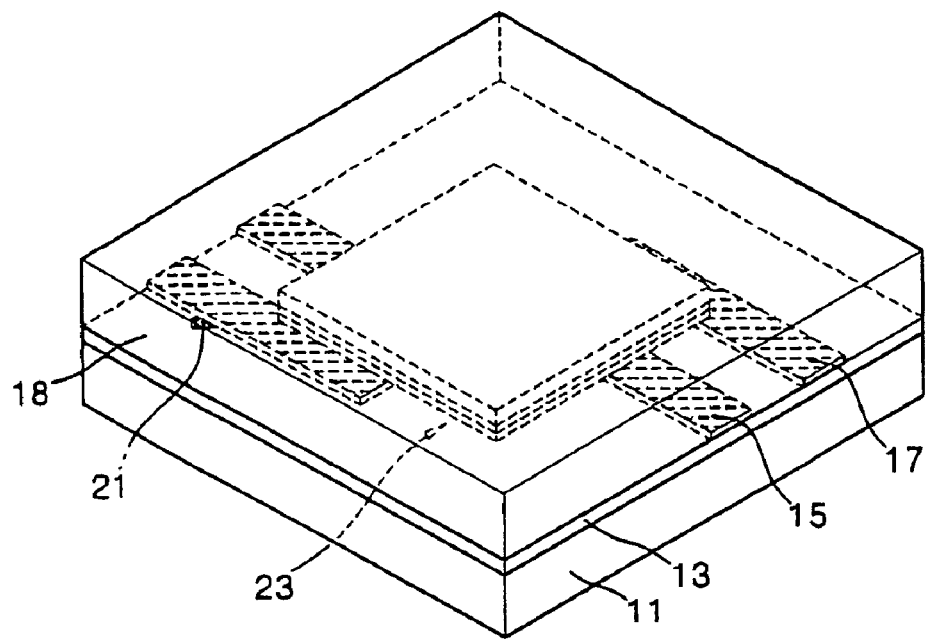
Figure 6H:
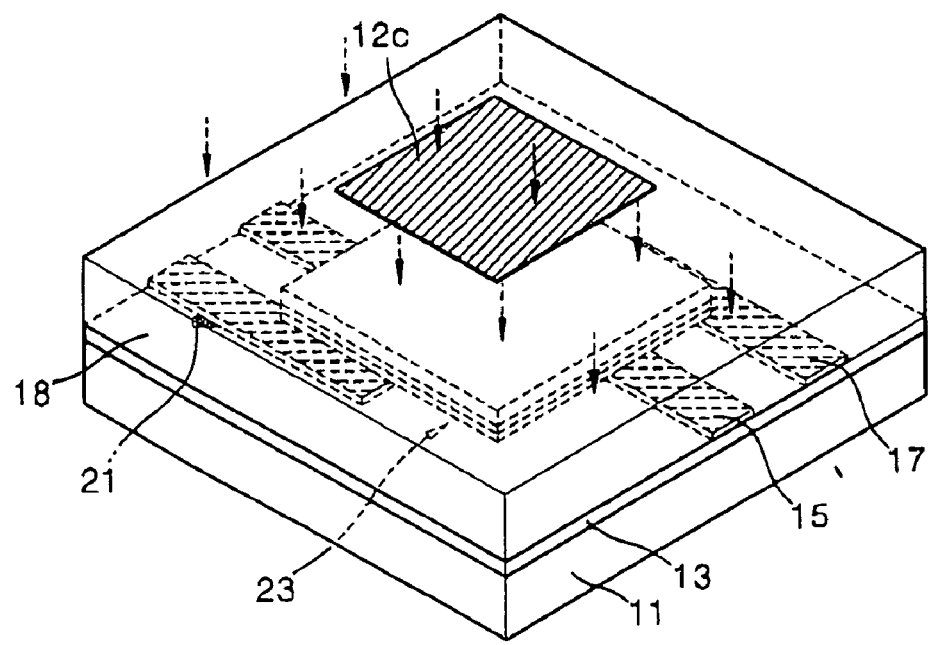
Figure 6I:
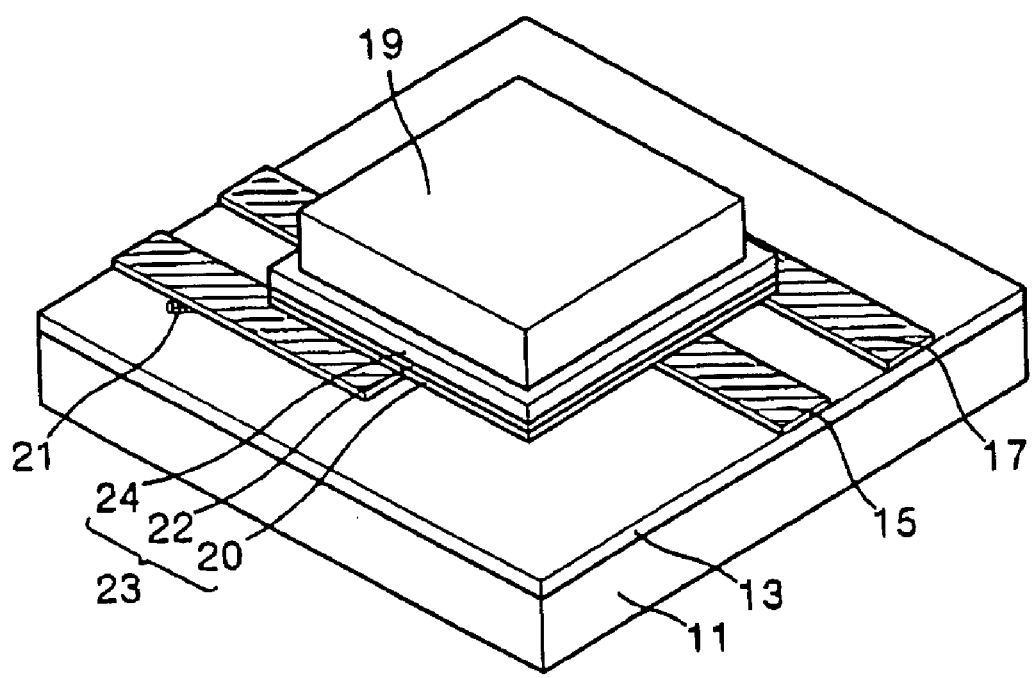

FIGS. 6G through 6I illustrate a process of forming the gate electrode 19 of FIG. 1. Referring to FIG. 6G, a metal layer 18 for forming the gate electrode 19 of FIG. 1 is deposited on the insulating layer 13 to cover the carbon nanotube 21 and the first memory cell 23. As shown in FIG. 6H, a mask 12c is positioned over the metal layer 18 and then exposed to ultraviolet radiation, and then the resultant structure is developed. After the procedure of FIG. 6H, the gate electrode 19 is formed as shown in FIG. 6I.

Figure 7A:
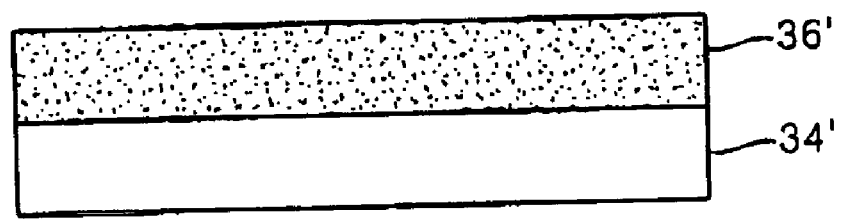
FIGS. 7A through 7E represent cross-sectional views for illustrating a method of manufacturing the third memory cell adopted in a memory device according to an embodiment of the present invention.
Figure 7B:
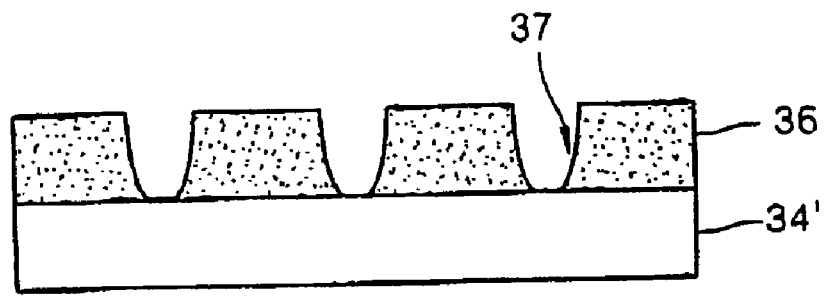

FIGS. 7A through 7E illustrate a method of manufacturing the third memory cell 35 of FIG. 3B, adopted in a memory device according to an embodiment of the present invention. First, as shown in FIG. 7A, the fifth insulating film 34' is oxidized to obtain an oxide film 36' thereon. By oxidizing the resultant structure with electricity and etching the same, a porous film 36 having a plurality of nanodots 37 is fabricated, as shown in FIG. 7B. If the fifth insulating film 34' is formed of aluminium, the aluminium is dipped into a sulphuric acid solution or a phosphoric acid solution and oxidized using electricity to form the plurality of nanodots 37. This oxidization is referred to as anodization. The aluminium is oxidized to turn it into alumina, which has a larger volume than the original aluminium.

Figure 7C:
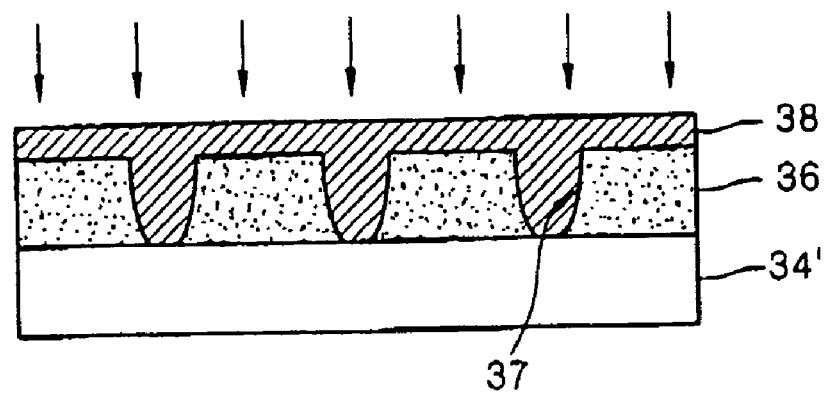
Figure 7D:
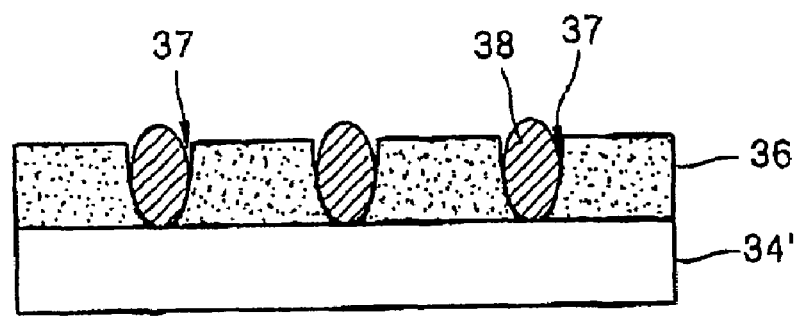
Figure 7E:
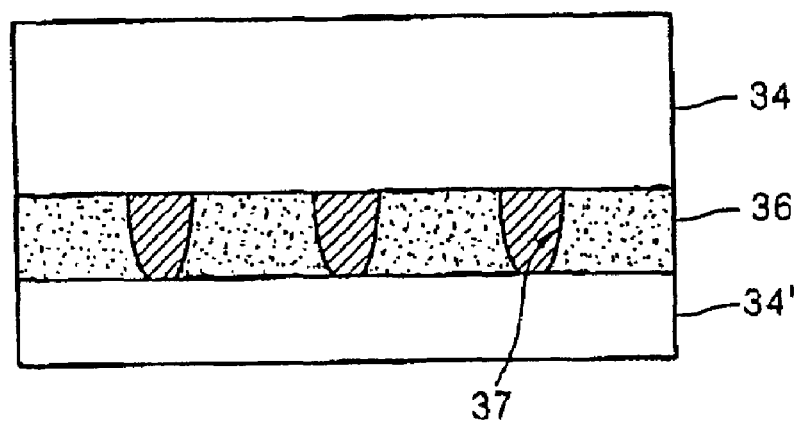

As shown in FIG. 7C, the nanodots 37 are filled with silicon or silicon nitride, the material of charge storage film 38, using CVD or a sputtering technique. Thereafter, as shown in FIG. 7D, the resultant nanodots 37 are dry-etched to form the porous film 36 for collecting charges. Then, as shown in FIG. 7E, fourth insulating film 34 is deposited on the porous film 36, thereby completing the fabrication of the third memory cell 35.

To fabricate a memory device including the third memory cell 35 according to an embodiment of the present invention, first, carbon nanotube 21 and the source and drain electrodes 15 and 17 are formed as shown in FIGS. 6A through 6C. Next, the third memory cell 35 is formed on the carbon nanotube 21 of FIGS. 6A through 6C, as shown in FIGS. 7A through 7E. Thereafter, as shown in FIGS. 6G through 6I, the gate electrode 19 is formed.

Fabrication of the second memory cell 25 of FIG. 3A may be similar to the fabrication method of the third memory cell 35 of FIG. 3B. As in the process of forming the third memory cell 35, the porous film 26 of second memory cell 25 having the plurality of nanodots 27, (illustrated in FIG. 3A) is formed by completely oxidizing the fifth insulating film 34' of FIG. 3B. Thereafter, the nanodots 27 are filled with the charge storage material 28, and the third insulating film 29 is then deposited on the resultant porous film 26, thereby forming the second memory cell 25 of FIG. 3A.

In a memory device according to an embodiment of the present invention, as illustrated in FIG. 6I, if the source electrode 15 is grounded, and a positive drain voltage is applied to the drain electrode 17, electrons move to the carbon nanotube 21, so that current flows. At this time, if a predetermined gate voltage higher than the drain voltage applied to the drain electrode 17 is applied to the gate electrode 19, electrons from carbon nanotube 21 move to the memory cell (23, 25, or 35), tunnel through the first insulating film 20 or the fifth insulating film 34' of FIG. 3B, and move to the charge storage film 22 or the nanodots 27 and 37 of FIGS. 3A and 3B, respectively. By adequately controlling the gate and drain voltages, electrons are stored in, erased from, and flow out of the charge storage film 22 and the nanodots 27 and 37, thereby achieving data recording, removal, and reproduction.

Figure 8A:
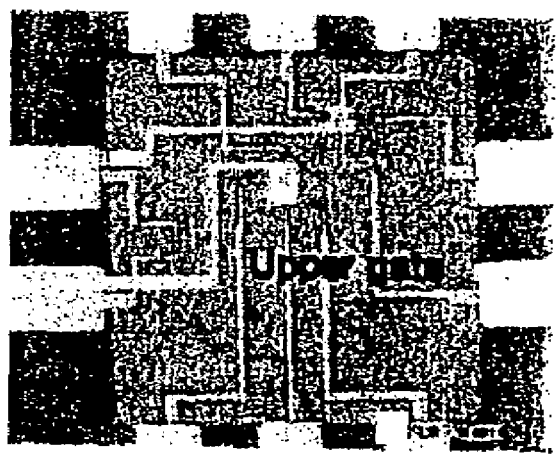
FIG. 8A represent a plan view of a memory device according to an embodiment of the present invention.
Figure 8B:
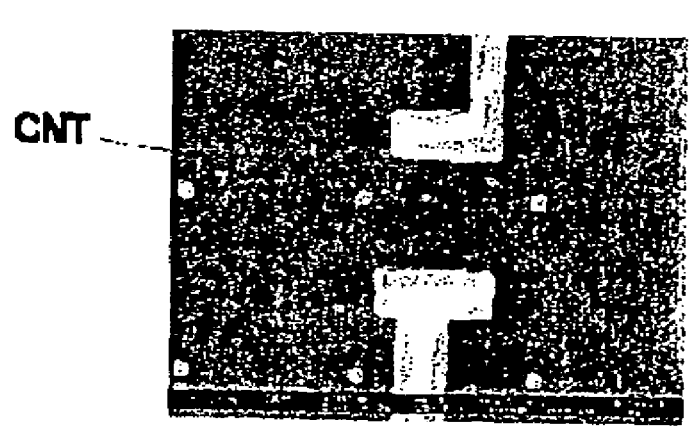
FIG. 8B shows a carbon nanotube channel between source and drain electrodes of the memory device of FIG. 8A.

FIG. 8A illustrates a plan view of a memory device according to an embodiment of the present invention including a single gate electrode, and a plurality of source and drain electrodes and a CNT that are located under the gate electrode. FIG. 8B illustrates a picture showing a CNT channel connecting a source electrode and a drain electrode of FIG. 8A.

A memory device according to an embodiment of the present invention is capable of operating as a volatile or nonvolatile memory by adequately controlling the material and thickness of the storage film for the memory cell, the diameter and length of each of the plurality of nanodots included in the porous film, the material filling the nanotube channel, the gate voltage, and the source-drain voltage.

Figure 9:
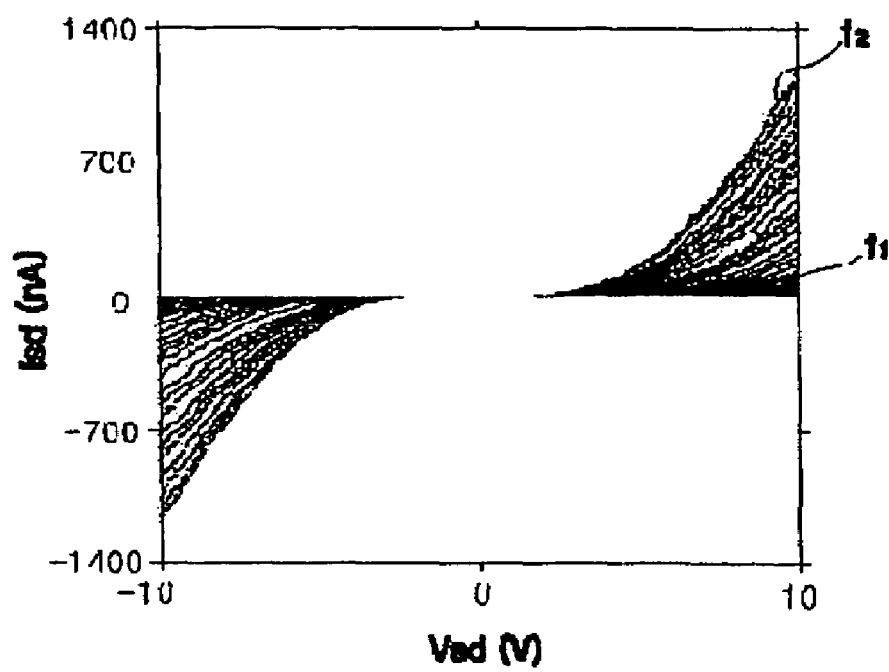
FIG. 9 is a graph of a source-drain current Isd versus a source-drain voltage Vsd in a memory device according to an embodiment of the present invention.

FIG. 9 is a graph showing a current between a source electrode and a drain electrode, $I_{sd}$, versus a voltage between the source electrode and the drain electrode, $V_{sd}$, when a gate voltage varies from 0V to 10V in a memory device according to an embodiment of the present invention.

Graph $f_1$ shows that when the gate voltage is 0V, the source-drain current $I_{sd}$ is 0 nA regardless of a variation in the source-drain voltage $V_{sd}$.

Graph $f_2$ shows that when the gate voltage is 10V, the source-drain current $I_{sd}$ increases from 0 nA to about 1000 nA as the source-drain voltage $V_{sd}$ increases from 0 to a positive value, but the source-drain current $I_{sd}$ decreases from 0 nA to about −1000 nA as the source-drain voltage $V_{sd}$ decreases from 0 to a negative value.

If the gate voltage is 0V at a certain source-drain voltage, no electrons move between a source electrode and a drain electrode, so that data writing cannot be achieved. If the gate voltage is greater than 0V, the source-drain current starts flowing. As the gate voltage increases, data storage may be achieved by seizing a predetermined number of electrons.

Figure 10:
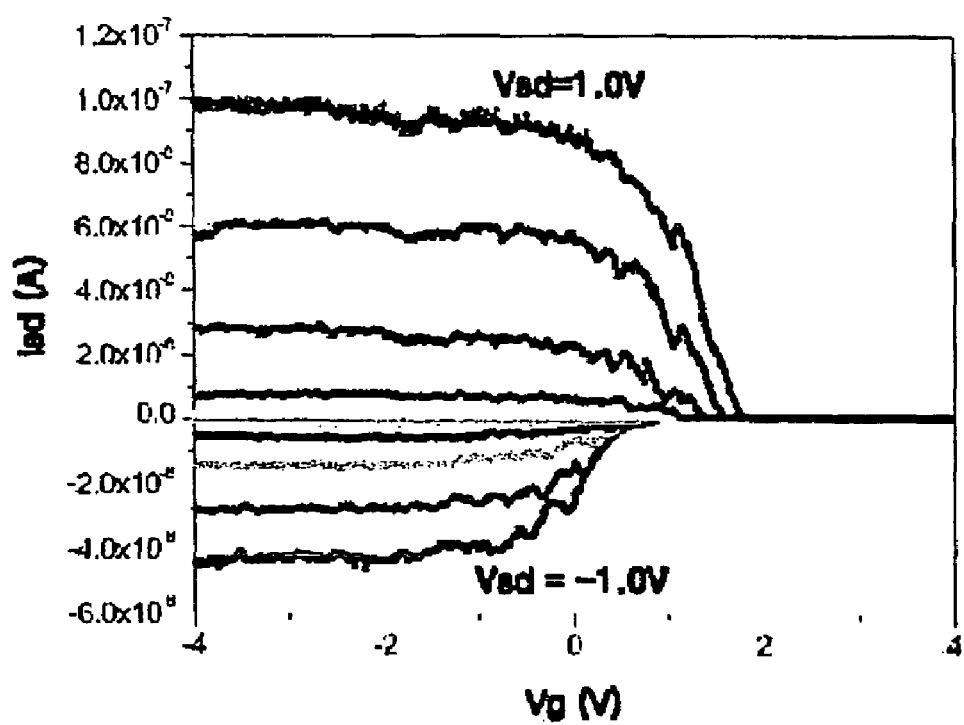
FIG. 10 is a graph of a source-drain current Isd versus a gate voltage Vg in a memory device according to an embodiment of the present invention.

FIG. 10 is a graph of a current $I_{sd}$ between a source electrode and a drain electrode versus a gate voltage $V_g$ in a p-type CNT field effect transistor (FET) having a charge storage film which is a 28 nm ONO thin film.

As shown in FIG. 10, in the p-type CNT FET, the source-drain current $I_{sd}$ increases with an increase in the negative voltage of the gate electrode, and decreases to several femto ampere (fA) when the voltage of the gate electrode is positive. A ratio of an on-state current $I_{on}$ to an off-state current $I_{off}$, $I_{on}/I_{off}$, exceeds $10^5$ at a source-drain voltage $V_{sd}$=1V, when the voltage of the gate electrode varies from −4V to 4V. The off-state current was measured to be maintained at several pA or less. It is considered that the maintenance of the off-state current at a low value is caused by the position of the gate electrode in the memory device and a high breakdown voltage of the ONO thin film. In the case of flash memory devices, a threshold voltage increases with an increase in the ratio $I_{on}/I_{off}$, thus improving performance.

Figure 11A:
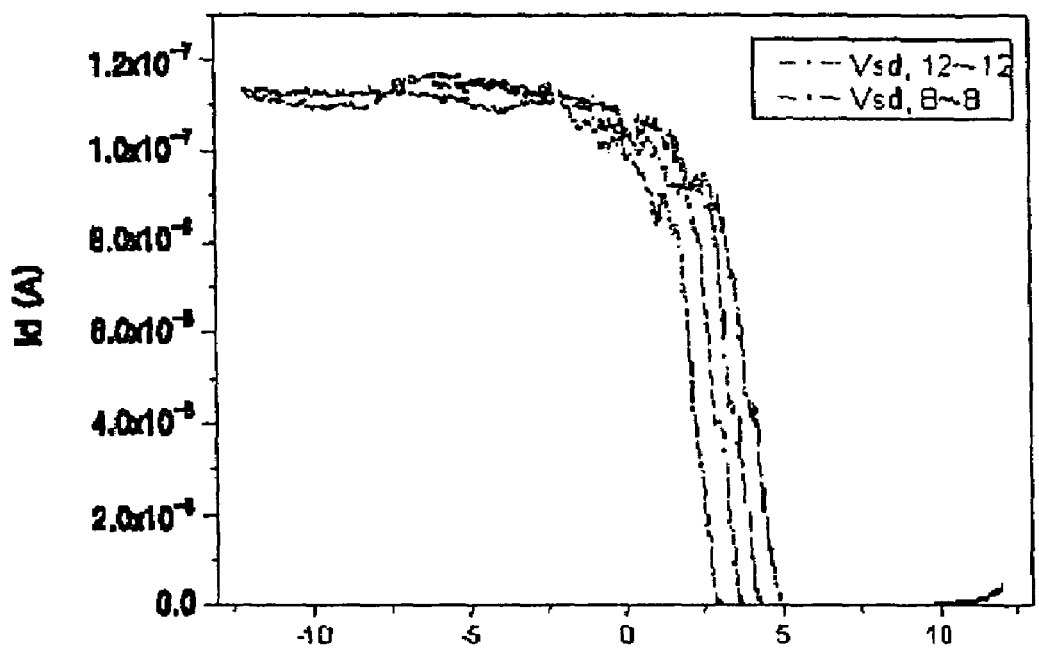
FIG. 11A is a graph of a source-drain current Isd versus a gate voltage Vg of a P-type memory device according to an embodiment of the present invention.
Figure 11B:
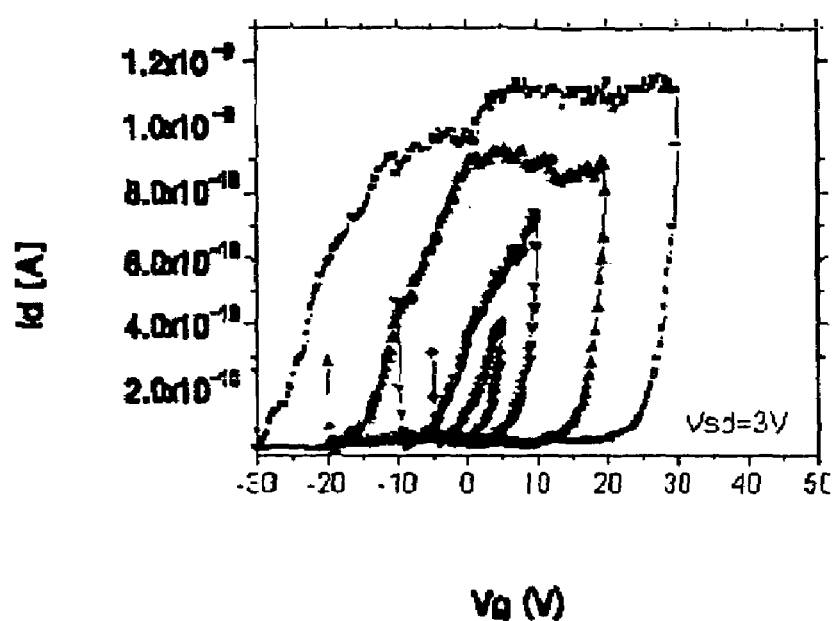
FIG. 11B is a graph of a source-drain current Isd versus a gate voltage Vg of an N-type memory device according to an embodiment of the present invention.

FIG. 11A shows the current-voltage (I-V) characteristics of a P-type CNT memory device including a 7 nm-thick memory cell ($SiO_2/Si_3N_4/SiO_2$). FIG. 11B shows the I-V characteristics of an N-type CNT memory device including a 30 nm-thick memory cell ($SiO_2/Si_3N_4/SiO_2$).

Referring to FIG. 11A, the drain current Id in the P-type CNT memory device varies slightly with respect to the source-drain voltage $V_{sd}$. However, if the gate voltage $V_g$ is about 2.5V, the drain current $I_d$ sharply decreases.

Referring to FIG. 11B, a drain current $I_d$ in the N-type CNT memory device shows a precise hysteresis at $V_{sd}$=3V if the gate voltage $V_g$ is equal to or greater than 4V.

Figure 12:
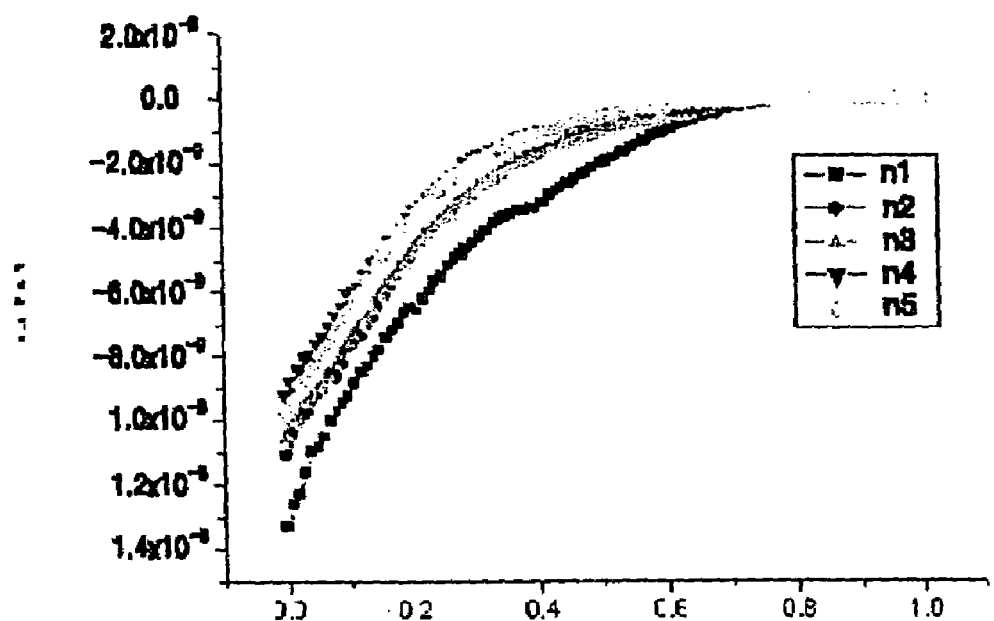
FIG. 12 is a graph of a drain current Id versus a gate voltage Vg, for a predetermined source-drain voltage, in an N-type memory device according to an embodiment of the present invention.

FIG. 12 is a graph of a drain current $I_d$ versus a gate voltage $V_g$, from 0V to 1V, when different source-drain voltages $V_{sd}$ are applied in an N-type CNT memory device. Referring to FIG. 12, n1 denotes the case when $V_{sd}$ is 0V, n2 denotes the case when $V_{sd}$ is −5V, n3 denotes the case when $V_{sd}$ is −5.5V, n4 denotes the case when $V_{sd}$ is −6V, and n5 denotes the case when $V_{sd}$ is −6.5V. As may be seen from n1 through n5, the drain current $I_d$ increases as the gate voltage $V_g$ increases, and is saturated at about 0.6V.

Given that h denotes the thickness of a memory cell, that is, an ONO film, and L and r denote the length and radius of a CNT, respectively, the electrostatic capacity of the CNT per unit length is expressed in Equation 1:

$$C/L \approx 2\pi\epsilon\epsilon_0/\ln(2h/r)$$

When an effective dielectric constant of the ONO film is −3, h is 30 nm, r is 1.5 nm, L is 1 μm, and a damage gate voltage $V_{gd}$ is 2V, a hole density (P) of 580 μm$^{-1}$ is obtained from Equation 1. A hole mobility ($\mu_h$) of the CNT can be calculated using Equation 2:

$$\mu_h = 29 \text{ cm}^2/(V \cdot S) \tag{2}$$

The above hole mobility ($\mu_h$) is greater than the hole mobility of a single wall nanotube or the hole mobility of a multi wall nanotube (MWNT).

Figure 13:
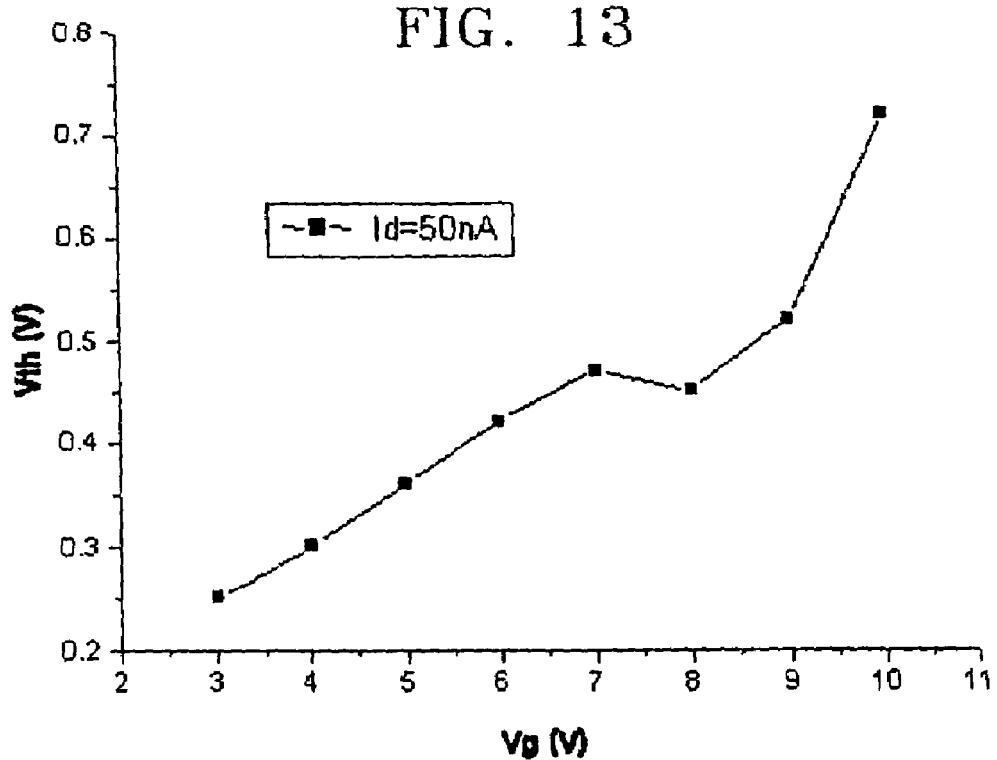
FIG. 13 is a graph of a threshold voltage Vth versus a gate voltage Vg, when a drain current $I_d$ is 50 nA, in a memory device according to an embodiment of the present invention.

FIG. 13 is a graph of a threshold voltage $V_{th}$ versus a gate voltage $V_g$ when a drain current $I_d$ is constantly 50 nA, in a memory device according to an embodiment of the present invention. As the positive gate voltage increases, the threshold voltage $V_{th}$ increases, which means that holes from the CNT are injected into an ONO thin film and fill a trap site. As may be seen from FIG. 13, when the gate voltage $V_g$ increases from 0V to 7V, the threshold voltage increases by about 60 mV and accordingly holes are found to be quasi-quantized.

Figure 14:
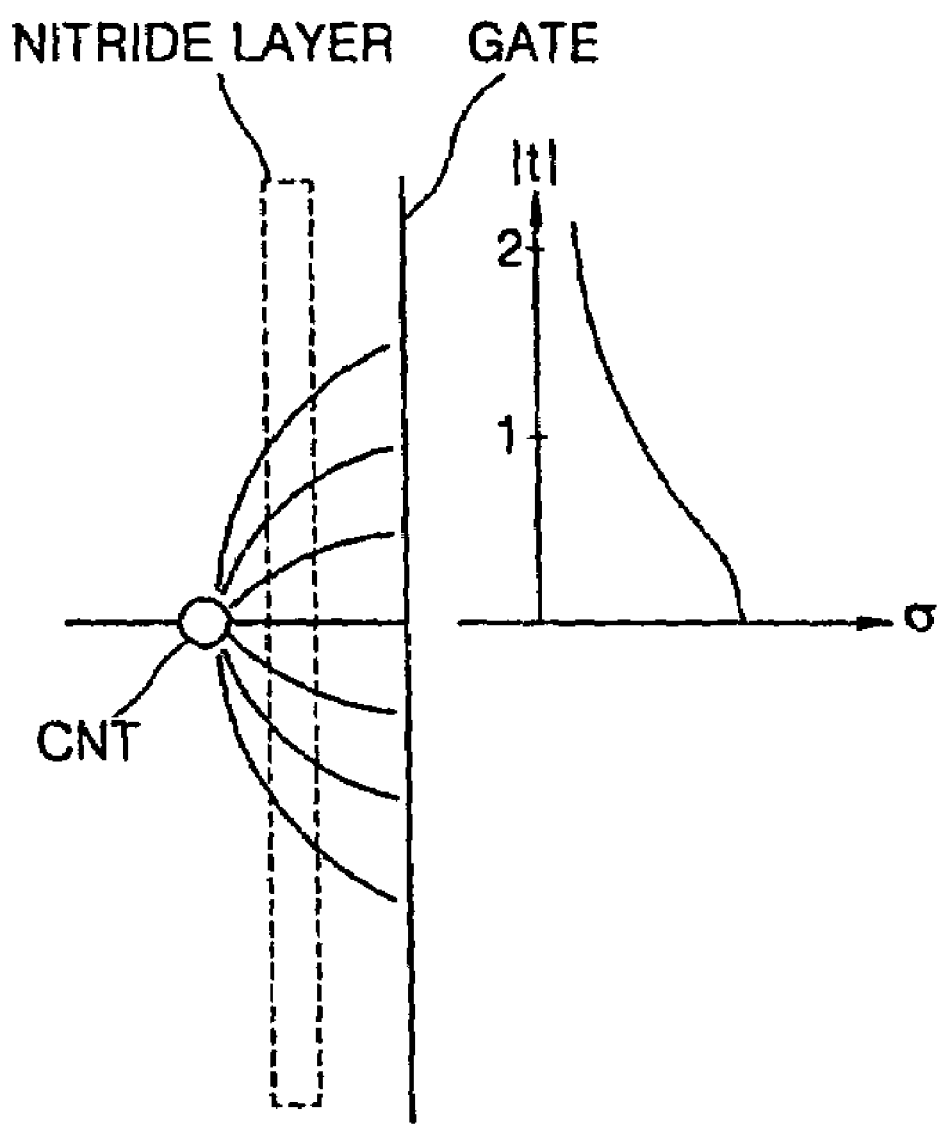
FIG. 14 shows a schematic diagram of an electric field between a carbon nanotube and a gate electrode in a memory device according to an embodiment of the present invention, and a graph of the surface induced charge density (σ) at the gate electrode versus a distance between the carbon nanotube (CNT) and the gate electrode in a memory device according to an embodiment of the present invention.

FIG. 14 shows a schematic diagram of an electric field between a CNT and a gate electrode and a graph of the surface induced charge density (σ) at the gate electrode versus a distance between the CNT and the gate electrode in a memory device according to an embodiment of the present invention.

Referring to FIG. 14, a gate voltage forms a strong electric field around the surface of the CNT. When the gate electrode is considered as a complete conductor, and the diameter of the CNT is 3 nm, an ONO thin film between the CNT and the gate electrode may be regarded as a single layer with an effective dielectric constant of 3. Hence, the electric field around the CNT may be calculated. If the gate voltage is 5V, the calculated electric field is 970V/μm, a strong field enough to induce a Fowler-Nordheim tunneling. Furthermore, if tunneling charges flow along electric field lines, they are trapped in a nitride thin film in proportion to the intensity of the electrical field calculated based on an induced charge distribution. In the electric field calculation, 70% of the entire tunneling charge corresponds to the full width at half maximum (FWHW) of the peak value of a charge density, and can flow into the nitride thin film with a 14 nm thickness included in the ONO thin film. It is known that charges are quantized at a room temperature when the size of a quantum dot is equal to or less than 10 nm. Referring to the graph of FIG. 14, an induced charge density (σ) increases with proximity to the CNT.

Figure 15:
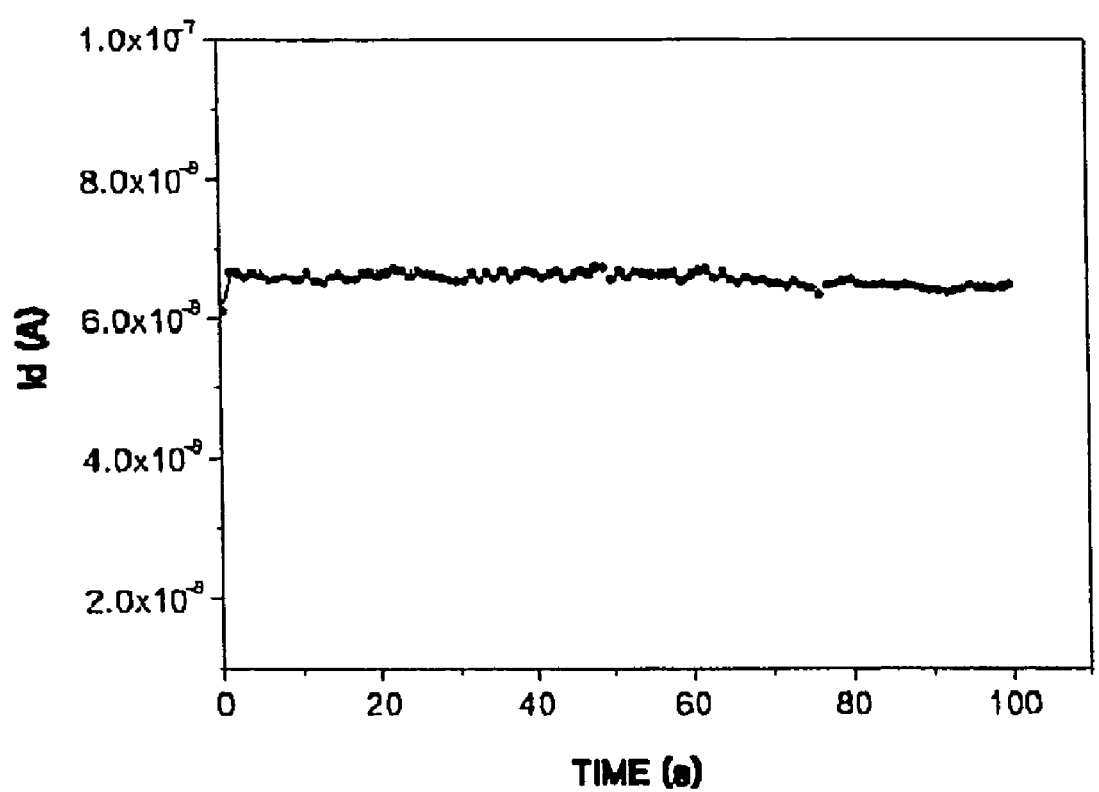
FIG. 15 is a graph of a drain current $I_d$ versus time in a memory device according to an embodiment of the present invention.

FIG. 15 is a graph of a drain current $I_d$ versus time for 100 seconds, in a memory device according to an embodiment of the present invention. A localized charge distribution enables charges to be induced into the nitride film of the ONO thin film due to a high electric field distribution of a localized CNT, and charges trapped in localized areas of the ONO thin film may be dispersed into areas where no charges are stored. However, as shown in FIG. 15, the entire amount of current remains constant over time. Accordingly, it is known that a charged trap site of the ONO thin film of the CNT memory device according to the present invention serves as a quantum dot of a flash memory device.

The present invention provides a non-volatile memory device using the CNT-FET and the ONO thin film, in which charges are stored in a trap site of the ONO thin film. The stored charges have a quantized voltage increment of about 60 mV, which means that the ONO thin film has a quasi-quantized energy state. The quantized energy state is related to a high localized electric field associated with a nano-scale CNT channel and represents that a CNT memory device functions as an ultrahigh-density large-capacity flash memory.

A memory device according to the present invention uses a CNT instead of an implantation channel to move charges between a source and a drain, and includes a charge storage film or a porous film having nanodots without need of an extra capacitor.

Also, because the CNT having high electrical conductivity and high thermal conductivity is used as an electron moving channel, a small transistor may be fabricated, thus enabling the fabrication of a highly-integrated, highly-efficient memory device.

In summary, a memory device according to the present invention includes a small transistor which uses a highly conductive CNT and a memory cell which stores electrons, thereby providing high efficiency and high integration.

Preferred embodiments of the present invention have been disclosed herein and, although specific terms are employed, they are used in a generic and descriptive sense only and not for purpose of limitation. Accordingly, it will be understood by those of ordinary skill in the art that various changes in form and details may be made without departing from the spirit and scope of the invention as set forth in the following claims.

What is claimed is:

1. A method of fabricating a carbon nanotube memory device, the method comprising:
   (a) forming a carbon nanotube on a substrate and forming a source electrode and a drain electrode in contact with the carbon nanotube such that the carbon nanotube between the source electrode and the drain electrode serves as a charge moving channel;
   (b) forming a memory cell in contact with the carbon nanotube by sequentially forming a first insulating film, a charge storage film, and a second insulating film on the carbon nanotube, the source electrode, and the drain electrode, and patterning the first insulating film, the charge storage film, and the second insulating film; and
   (c) forming a gate electrode which controls the amount of charge flowing from the carbon nanotube into the charge storage film by forming a metal layer on the second insulating film and patterning the metal layer, wherein forming the charge storage film includes:
      forming a porous charge storage material layer having a plurality of nanodots therein, and
      depositing a charge storage material in the nanodots.

2. The method as claimed in claim 1, wherein in (a), an insulating layer is formed on an upper surface of the substrate, and the carbon nanotube is formed on an upper surface of the insulating layer.

3. The method as claimed in claim 2, wherein the substrate is formed of silicon, and the insulating layer is formed of silicon oxide.

4. The method as claimed in claim 1, wherein in (b), the second insulating film is formed to a thickness approximately double the thickness of the charge storage film.

5. The method as claimed in claim 4, wherein in (b), the first insulating film is formed to a thickness similar to the thickness of the charge storage film.

6. The method as claimed in claim 1, wherein the charge storage film has a thickness of 15 nm or less.

7. A method of fabricating a carbon nanotube memory device, the method comprising:
   (a) forming a carbon nanotube on a substrate and forming a source electrode and a drain electrode in contact with the carbon nanotube such that the carbon nanotube between the source electrode and the drain electrode serves as a charge moving channel;
   (b) forming a porous film having a plurality of nanodots by forming a first insulating film on upper surfaces of the carbon nanotube and the source and drain electrodes, and oxidizing and etching the first insulating film using electricity;
   (c) filling the nanodots with a charge storage material by depositing the charge storage material on an upper surface of the porous film and then etching the charge storage material;
   (d) forming a memory cell by forming a second insulating film on the upper surface of the porous film and patterning the second insulating film and the porous film; and
   (e) forming a gate electrode which controls the amount of charge flowing from the carbon nanotube into the porous film having the filled nanodots by forming a metal layer on the second insulating film and patterning the metal layer.

8. The method as claimed in claim 7, wherein in (a), an insulating layer is formed on an upper surface of the substrate, and the carbon nanotube is formed on an upper surface of the insulating layer.

9. The method as claimed in claim 8, wherein the substrate is formed of silicon, and the insulating layer is formed of silicon oxide.

10. The method as claimed in claim 7, wherein in (b), the second insulating film is formed to a thickness approximately double the thickness of the porous film.

11. The method as claimed in claim 7, wherein the porous film is formed to a thickness of 15 nm or less.

12. The method as claimed in claim 7, wherein in step (a), an entire thickness of the first insulating film is oxidized to form the porous film having the plurality of nanodots.

13. The method as claimed in claim 7, wherein the porous film is formed of aluminum oxide.

14. The method as claimed in claim 1, wherein forming the porous charge storage material layer includes:
   depositing a first material layer, and
   oxidizing the first material layer with electricity.

15. The method as claimed in claim 1, wherein the first material layer includes aluminum, and the porous charge storage material layer includes aluminum oxide.

16. The method as claimed in claim 1, wherein a thickness ratio of the first insulating film:charge storage film:second insulating film is about 1:1:2.

17. The method as claimed in claim 1, further comprising forming a second source electrode and a second drain electrode in contact with the carbon nanotube such that the carbon nanotube extends between the second source electrode and the second drain electrode, wherein forming the memory cell includes forming the first insulating film, the charge storage film, and the second insulating film on the second source electrode and the second drain electrode.

18. The method as claimed in claim 7, wherein forming the porous film includes:
depositing a layer that includes aluminum, and
anodizing the aluminum.

19. The method as claimed in claim 7, further comprising forming a second source electrode and a second drain electrode in contact with the carbon nanotube such that the carbon nanotube extends between the second source electrode and the second drain electrode, wherein forming the porous film includes forming the porous film on the second source electrode and the second drain electrode.

20. A method of fabricating a carbon nanotube memory device, the method comprising:
forming a carbon nanotube on a substrate and forming a source electrode and a drain electrode in contact with the carbon nanotube such that the carbon nanotube extends between the source electrode and the drain electrode;

forming a memory cell in contact with the carbon nanotube by sequentially forming a first insulating film, a charge storage film, and a second insulating film on the carbon nanotube, the source electrode, and the drain electrode;

patterning the first insulating film, the charge storage film, and the second insulating film; and forming a gate electrode on the second insulating film, wherein a thickness ratio of the first insulating film : charge storage film: second insulating film is about 1:1:2.

* * * * *